United States Patent

[11] 3,579,814

[72] Inventor Frederick H. Dill, Jr.
Putnam Valley, N.Y.
[21] Appl. No. 734,185
[22] Filed Mar. 18, 1968
Division of Ser. No. 446,780, Mar. 31, 1965,
Pat. No. 3,398,335.
[45] Patented May 25, 1971
[73] Assignee International Business Machines Corporation
Armonk, N.Y.

[54] METHOD FOR FABRICATING A SEMICONDUCTOR DEVICE HAVING AN EPITAXIALLY GROWN REGION
9 Claims, 5 Drawing Figs.

[52] U.S. Cl. 29/578, 29/589, 148/175
[51] Int. Cl. B01j 17/00, H01l 5/00
[50] Field of Search 29/578, 576 (T), 589, 590, 576 (E); 317/234/5; 148/(Digests)

[56] References Cited

UNITED STATES PATENTS

| | | | |
|---|---|---|---|
| 3,189,973 | 6/1965 | Edwards et al. | 317/235 |
| 3,226,611 | 12/1965 | Haenicken | 29/576 |
| 3,237,271 | 3/1966 | Arnold et al. | 29/578 |

*Primary Examiner*—John F. Campbell
*Assistant Examiner*—W. Tupman
*Attorneys*—John E. Dougherty, Jr., John F. Hanifin and J. Jancin, Jr.

ABSTRACT: Disclosed is a method of making minute semiconductor devices wherein superposed apertured insulating, metal contact and insulating layers are applied to the semiconductor base layer and semiconductor material is provided within the aperture but spaced from the metal contact layer by the second insulating layer.

PATENTED MAY 25 1971 3,579,814

Figure 2A:
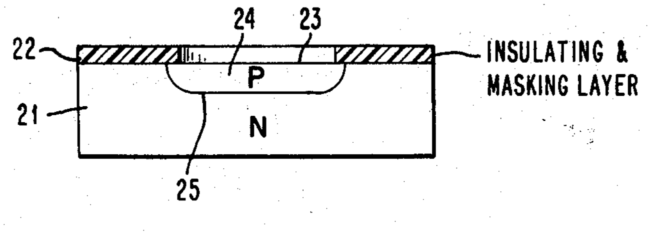

INVENTOR.
FREDERICK H. DILL, JR.

BY Harry M Weiss
ATTORNEY

METHOD FOR FABRICATING A SEMICONDUCTOR DEVICE HAVING AN EPITAXIALLY GROWN REGION

This application is a division of copending application Ser. No. 446,780, filed Mar. 31, 1965, now U.S. Pat. No. 3,398,335.

This invention relates to an improved technique for fabricating semiconductor devices, including transistors, and to an improved transistor structure resulting therefrom. More specifically, the invention is concerned with the fabrication of extremely minute semiconductor devices and the circuits integrally constituted by such minute devices.

Recent advances in the semiconductor fabrication art have resulted in the development of techniques for making high frequency transistor devices which typically have dimensions of the order of mils ($10^{13}$ inches). In making these devices only a very limited area of the base region of the transistor remains exposed so that contact is exceedingly difficult to make to the base region. The present invention is directed to an improvement in the formation of contacts to the base region of such transistor devices.

Accordingly, it is a primary object of the present invention to provide an improved technique for fabricating very small semiconductor devices.

In the so-called planar technique for the manufacture of transistor devices the essential junctions which characterize the devices are defined by the sequential steps of diffusing several impurities through a mask or masks and the junctions thus defined are protected at the surface of the semiconductor body by the aforesaid mask or masks.

As currently practiced this planar technique has the undesirable limitation that the base contact must be fitted between separated mask portions that remain over the respective emitter and collector junctions at the surface of the semiconductor body. The present invention overcomes this limitation by providing a base contact layer situated entirely over the initially exposed area of the base region at the surface of the body. The emitter region is subsequently formed so as to be separated from the base contact layer by an insulating film, as will be described hereinafter.

The significant features and advantages of the present invention are dependent on the fact that the base contact is separated from the emitter by a distance which is based upon the thickness of the aforesaid insulating film rather than by requirements of mask precision and alignment. This allows the separation between the emitter and the base contact to be reduced by about an order of magnitude from about 5 microns (in best practice) to 0.2 micron or less. This allows the so-called external base resistance to be very much reduced. Additionally, the size of the emitter junction is controlled by the size of a hole etched in a film and thus does not depend upon the necessity to register later processing with the opening or hole on the film. This allows emitter openings in the form of an array of small spots or narrow lines and this in turn lowers the base resistance additionally and allows emitter openings narrow enough (0.1 mil) that current crowding will not be important. Current crowding is the concentration of the emitter current at the edges of the emitter junction closest to the base contact.

The foregoing and other objects, features and advantages of the invention will be apparent from the following more particular description of preferred embodiments of the invention, as illustrated in the accompanying drawings.

Figure 1:
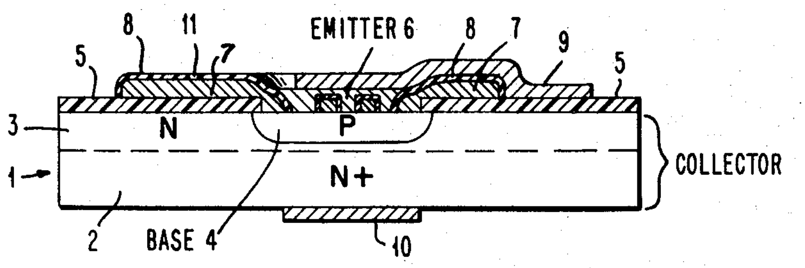

In the drawings:

FIG. 1 is a sectional view of a transistor structure manufactured in accordance with a preferred embodiment of the present invention.

FIGS. 2A—2D are sectional views of a transistor structure at separate stages of manufacture in accordance with the present invention.

Referring now to FIG. 1 a transistor structure 1 is shown. This structure may be considered as a segment removed from a large wafer for example, of germanium, or in the case of a monolithic array consisting of a plurality of like structures, the transistor structure 1 is viewed as a single unit thereof. The initial substrate 2 is selected to be of extremely high N-type conductivity, designated by the symbol $N^+$. Immediately contiguous thereto is a region 3 composed of a thin layer which has been epitaxially formed on the substrate 2 and is likewise of N conductivity type but with a smaller impurity concentration.

Those skilled in the art will recognize the previously described construction as part of what is known as the "epitaxial transistor" design. Part of the region 3 has been converted to the opposite conductivity type, P-type in this instance. This region 4 constitutes, in one embodiment, the base region of the transistor. Layer 5 is an insulator, preferably an oxide coating, such as silicon oxide, which acts as a mask and protective agent. The emitter region 6 of the transistor structure 1 is shown in contact with the base region 4 and is separated from the base contact layer 7 by an insulating film 8 formed in a manner to be described hereinafter. A metal layer 9 overlays and makes contact with the emitter region 6 and is disposed over the insulating layer 8 and the insulating layer 5. Ohmic contact 10 is made to the substrate region 2, thus serving as the contact to the collector of the device. A hole 11 is provided through layer 8 to the base contact layer 7 for circuit connecting purposes.

Referring to FIGS. 2A—2D the several stages in the manufacture of a transistor structure, in most respects identical to that shown in FIG. 1, are illustrated. In this set of FIGS. the structure has been simplified and only an N-type substrate, without the epitaxial layer, is considered.

In the first stage illustrated by FIG. 2A an oxide coating or layer 22 is formed into a mask on a wafer 21, the mask having an opening 23 therein. The oxide coating is formed preferably of silicon oxide and many methods of forming such a layer are known in the art; for example, by evaporation onto the wafer or, by pyrolytic decomposition of ethyl silicate vapor on the surface of the crystal wafer. The removal of the oxide layer within the opening 23 is accomplished by photoresist techniques well known to those skilled in the art. The region 24 of P conductivity type is produced in the wafer 21 for example, by diffusion of an acceptor impurity through the opening 23, with application of sufficient heat to raise the wafer to a suitable temperature. A junction 25 is defined by the opposite conductivity type regions 21 and 24. It will be noted that the thickness of the base region 24 is the final thickness for this region—in the preferred case of forming only the emitter epitaxially, as will be described later.

Figure 2B:
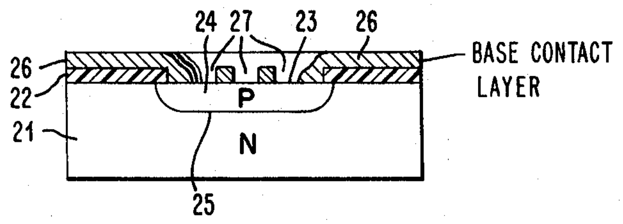

In FIG. 2B there is shown the addition of a base contact layer 26 formed over the oxide layer 22 and into the original opening 23. This contact layer typically is evaporated onto the wafer. It is made of a material which fulfills two requirements: 1. it must make a good ohmic contact to the base; 2. it must be such that an anodized oxide or other stable insulating film can be formed on the surface. Aluminum would be one such suitable material for the illustrated transistor structure. Other suitable materials include tantalum, nickel and tin.

The base contact layer 26 is then etched using photoresist techniques to 1. delineate the base contact area externally, including the contact pad extended out over the silicon oxide layer and 2. make very small holes or stripes through which the emitter region will be formed. In FIG. 2B the new holes 27 for the emitter deposition are shown, having been etched into the layer 26.

Although a plurality of emitter holes 27 have been shown as formed in the base contact layer 26 to provide for the emitter deposition, it will be understood that only a single hole is necessary for the deposition.

Figure 2C:
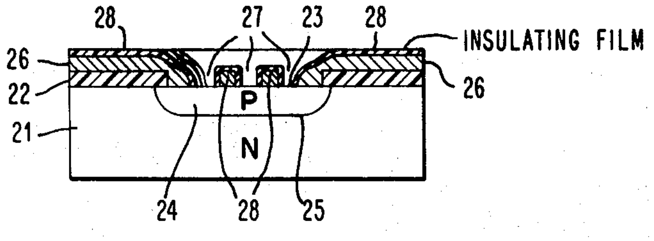
Figure 2D:
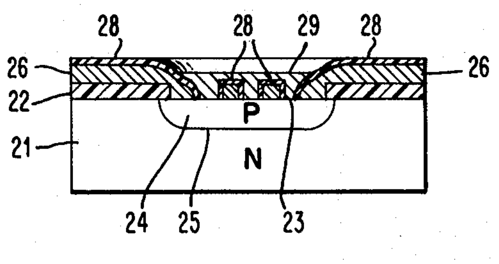

After opening the emitter holes 27 in the aluminum base contact layer 26 the aluminum layer has an insulating film 28 formed over it. This film 28 has formed on the aluminum by a treatment such as anodization or heat treatment in an atmosphere containing hydrogen gas and water vapor. This puts a stable insulating aluminum oxide film, as shown in FIG. 2C on the aluminum.

After forming the insulating film 28, an N-type expitaxial film is grown using the silicon oxide and anodized aluminum for masking. This epitaxial film is achieved preferably by using what is known as a vapor growth technique, such as the halide vapor growth technique exemplified in U.S. Pat. No. 3,072,507. This epitaxial film is designated 29 in FIG. 2D and, as shown, has filled in the holes in the aluminum film and is continued, if desired, to actually close across between emitter openings 27. This step forms an emitter region which is insulated from the base contact by the thin (a few hundred to a few thousand angstroms) insulating aluminum oxide layer.

In an alternate arrangement the aluminum base contact layer 26 is first covered with an additional silicon oxide film, before the etching step that is employed to delineate the contact area and emitter junction area, as described previously. The photoresist etching is then done to both films leaving the second silicon oxide layer over the aluminum for better insulation, better vapor growth masking, and to lower capacitance. With this arrangement only the exposed edges of the aluminum layer 26 need have an insulating film formed on them. This film could be rather thin without having an excessive capacitance penalty.

A further alternate method of fabrication of this structure is to make use of a base contact covered with silicon oxide. (The base diffused region in this case will be shallower than the final base thickness.) After opening the emitter holes in the base contact and overlying oxide an epitaxial deposition is performed to extend the base region through the holes, scaling the noninsulated edges of the base contact. The emitter region is then deposited epitaxially as in the previous embodiment. This method of fabrication allows the use of a wider variety of base contact materials than in the preferred embodiment since the need to form an insulating film on the metal is eliminated. It also more easily permits alloying of the base contact, if necessary, to improve its electrical characteristics.

The invention has been described herein with particular reference to a single transistor structure in order to simplify and make clear the concepts thereof. However, it will be appreciated that the principle of the present invention is readily applicable to the formation of integrated arrays of small transistor devices in order to provide, for example, complete transistor logic circuits. The only other requirement that is necessary to realize such circuits is to provide suitable interconnection patterns on the matrix or substrate between individual contact pads that are provided for each unit as described hereinabove.

While the invention has been particularly shown and described with reference to preferred embodiments thereof, it will be understood by those skilled in the art that the foregoing and other changes in form and details may be made therein without departing from the spirit and scope of the invention.

I claim:

1. A process of fabricating a semiconductor device comprising the steps of:

forming an insulating layer on a surface of a semiconductor wafer, opening a hole through said insulating layer to expose a limited surface area of said wafer, converting a surface portion of said wafer to opposite conductivity type, whereby at least a part of a first region of said device is produced, forming a metal layer over said insulating layer and into the hole therein, thereby to contact the surface of said wafer, forming at least one opening in said metal layer reaching to said first region, forming an insulating film of said metal layer, epitaxially growing a layer of semiconductor material onto said first region through said at least one opening in said metal layer while maintaining the thickness of said first region constant, and forming a contact to said last formed layer of semiconductor material.

2. A process of fabricating a semiconductor device comprising the steps of:

forming an insulating layer on a surface of a semiconductor wafer;

opening a hole through said insulating layer to expose a limited surface area of said wafer, diffusing an impurity into the wafer through said hole to convert a surface portion of the wafer to opposite conductivity type, whereby at least a part of the base region of said device is produced, forming a metal layer over said insulating layer and into the hole therein, thereby to contact the surface of said wafer, forming at least one opening in said metal layer reaching to said base region, forming an insulating film on said metal layer, epitaxially growing a semiconductor emitter onto said base region through said at least one opening in said metal layer while maintaining the thickness of said base region constant, and forming a metal layer in contact with said emitter.

3. A method of fabricating semiconductor devices as defined in claim 2 wherein the semiconductor wafer is constituted of germanium of N conductivity type and the diffused impurity is P conductivity type determining.

4. A method as defined in claim 3 wherein the insulating layer is of silicon oxide, the metal layer is of aluminum and the insulating film on said metal layer is of aluminum oxide.

5. A process of fabricating a semiconductor device comprising the steps of:

forming an insulating layer on a surface of a semiconductor wafer;

opening a hole through said insulating layer to expose a limited surface area of said wafer, converting a surface portion of said wafer to opposite conductivity type, whereby at least a part of a base region of said device is produced, forming a metal layer over said insulating layer and into the hole therein thereby to contact the surface of said wafer, etching said metal layer to create a plurality of openings therein, each opening extending to said base region, forming an insulating film of said metal layer, growing a semiconductor emitter region onto said base region through said plurality of openings in said metal layer while maintaining the thickness of said base region constant, and forming a metal contact to said emitter region.

6. A process of fabricating a semiconductor device comprising the steps of:

forming an insulating layer on a surface of a semiconductor wafer, opening a hole through said insulating layer to expose the limited surface area of said wafer, converting a surface portion of said wafer to opposite conductivity type, whereby at least a part of a base region of said device is produced, forming a metal layer over said insulating layer and into the hole therein thereby to contact the surface of said wafer, depositing a second insulating layer onto said metal layer, etching said metal layer and said second insulating layer to create at least one opening therein which extends to said base region, and to expose said metal layer in only those portions of said metal layer which bound said at least one opening, forming an insulating film of said metal layer on said exposed portions of said metal layer, forming a semiconductor emitter region on said base region within said at least one opening while maintaining the thickness of said base region constant, and forming a contact to said emitter region.

7. A process of fabricating a semiconductor device comprising the steps of:

forming an insulating layer on a surface of a semiconductor wafer, opening a hole through said insulating layer to expose a limited surface area of said wafer, converting a surface portion of said wafer to opposite conductivity type, whereby a first part of the base region of said device is produced, forming a metal layer over said insulating layer and into the hole therein, thereby to contact the surface of said wafer, forming at least one opening in said metal layer reaching to said base region, epitaxially depositing semiconductor material onto said base region through said at least one opening in said metal layer while maintaining the thickness of said first part of said base region constant, said deposition sealing the edges of said metal layer which bound said at least one opening, epitaxially depositing a semiconductor emitter region onto said deposited semiconductor material while maintaining the thickness of said first part of said base region and said deposited semiconductor material constant and forming a contact to said emitter region.

8. The process of claim 7, wherein said semiconductor wafer is comprised of germanium of N-type conductivity and said base region is of P-type conductivity.

9. The process of claim 8, wherein said insulating layer is silicon oxide and said metal layer is aluminum.